(12) United States Patent
Katrak et al.

(10) Patent No.: US 9,970,991 B2
(45) Date of Patent: May 15, 2018

(54) DIAGNOSTIC SYSTEM FOR A BATTERY SYSTEM

(71) Applicant: LG Chem, Ltd., Seoul (KR)

(72) Inventors: Kerfegar K. Katrak, Fenton, MI (US); Su Hyuk Jang, Sterling Heights, MI (US)

(73) Assignee: LG Chem, Ltd., Seoul (KR)

( * ) Notice: Subject to any disclaimer, the term of this patent is extended or adjusted under 35 U.S.C. 154(b) by 60 days.

(21) Appl. No.: 15/230,960

(22) Filed: Aug. 8, 2016

(65) Prior Publication Data

US 2017/0343614 A1 Nov. 30, 2017

Related U.S. Application Data

(60) Provisional application No. 62/341,754, filed on May 26, 2016.

(51) Int. Cl.
*G01R 31/36* (2006.01)
*B60L 11/18* (2006.01)

(52) U.S. Cl.
CPC ...... *G01R 31/3658* (2013.01); *B60L 11/1851* (2013.01)

(58) Field of Classification Search
USPC ................................................ 324/433, 434
See application file for complete search history.

(56) References Cited

U.S. PATENT DOCUMENTS

| 8,723,527 B2 | 5/2014 | Kudo et al. |
| 8,854,047 B2 | 10/2014 | Mizoguchi et al. |
| 9,404,975 B2 | 8/2016 | Kudo et al. |
| 2013/0253722 A1* | 9/2013 | Nakamura .......... B60R 16/0232 700/295 |
| 2014/0285146 A1* | 9/2014 | Huston ............... B60L 11/1816 320/109 |

\* cited by examiner

*Primary Examiner* — Vincent Q Nguyen
(74) *Attorney, Agent, or Firm* — Buckert Patent & Trademark Law Firm PC; John F. Buckert

(57) ABSTRACT

A diagnostic system for a battery system in accordance with an exemplary embodiment is provided. The battery system includes a battery module electrically coupled to a contactor. The diagnostic system includes a first microcontroller and a second microcontroller operably communicating with the first microcontroller. The second microcontroller is programmed to open the contactor electrically coupled to the battery module if either a first diagnostic indicator flag is equal to a first fault value or a second diagnostic indicator flag is equal to a second fault value. The second microcontroller is further programmed to open the contactor if either a third diagnostic indicator flag is equal to a third fault value or a fourth diagnostic indicator flag is equal to a fourth fault value.

11 Claims, 5 Drawing Sheets

DIAGNOSTIC SYSTEM FOR A BATTERY SYSTEM

CROSS-REFERENCE TO RELATED APPLICATIONS

This application claims priority to U.S. Provisional Patent Application No. 62/341,754 filed on May 26, 2016, the entire contents of which are hereby incorporated by reference herein.

BACKGROUND

A limitation of other diagnostic systems for battery modules is that each diagnostic system typically opens a contactor associated with the battery module based on a single diagnostic flag which is set to a fault value based on a single signal at a single hardware device. Thus, if the single hardware device is malfunctioning, a desired opening operation of the contactor may not occur.

The inventive diagnostic system provides a technical effect of performing a first diagnostic test on a battery system utilizing first and second diagnostic indicator flags determined utilizing first and second hardware devices (e.g., analog-to-digital converter in a first microcontroller, and a fault line coupled between first and second microcontrollers), respectively. The inventive diagnostic system can open a contactor based on the first and second diagnostic indicator flags. Further, the inventive diagnostic system performs a second diagnostic test on the battery system utilizing third and fourth diagnostic indicator flags determined from third and fourth hardware devices (e.g., voltage comparators in a first microcontroller, and a serial bus), respectively. Further, the inventive diagnostic system can open a contactor based on the third and fourth diagnostic indicator flags.

SUMMARY

A diagnostic system for a battery system in accordance with an exemplary embodiment is provided. The battery system has a battery module electrically coupled to a contactor. The diagnostic system includes a first microcontroller programmed to measure at least first and second cell voltage levels of first and second battery cells, respectively, of the battery module. The first microcontroller is further programmed to transmit the first and second cell voltage levels to a second microcontroller. The first microcontroller has first and second voltage comparators therein. The first and second voltage comparators compare each of the first and second cell voltage levels, respectively, to a threshold cell voltage level. The first and second voltage comparators output first and second comparator output bits, respectively. The first microcontroller is further programmed to set a fault line to a first fault line voltage if at least one of first and second comparator output bits indicate that at least one of the first and second cell voltage levels, respectively, is greater than the threshold cell voltage level. The fault line is operably coupled to the second microcontroller. The second microcontroller is programmed to set a first diagnostic indicator flag equal to a first fault value if at least one of the first and second cell voltage levels of first and second battery cells, respectively, is greater than the threshold cell voltage level. The second microcontroller is further programmed to set a second diagnostic indicator flag equal to a second fault value if the fault line has the first fault line voltage. The second microcontroller is further programmed to open the contactor electrically coupled to the battery module if either the first diagnostic indicator flag is equal to the first fault value or the second diagnostic indicator flag is equal to the second fault value.

A diagnostic system for a battery system in accordance with another exemplary is provided. The battery system has a battery module electrically coupled to a contactor. The diagnostic system includes a first microcontroller having first and second voltage comparators therein. The first and second voltage comparators compare each of first and second cell voltage levels, respectively, of first and second battery cells, respectively, of the battery module to a first threshold cell voltage level. The first and second voltage comparators output first and second comparator output bits, respectively. The first microcontroller is programmed to transmit the first and second comparator output bits from the first and second voltage comparators, respectively, to a second microcontroller. The first microcontroller is further programmed to measure a module output voltage level of the battery module. The first microcontroller is further programmed to transmit the module output voltage level to the second microcontroller. The second microcontroller is further programmed to set a first diagnostic indicator flag equal to a first fault value if at least one of the first and second comparator output bits indicate at least one of the first and second cell voltage levels, respectively, is greater than the first threshold cell voltage level. The second microcontroller is further programmed to set a second diagnostic indicator flag equal to a second fault value if the module output voltage level is greater than a threshold module output voltage level. The second microcontroller is further programmed to open the contactor electrically coupled to the battery module if either the first diagnostic indicator flag is equal to the first fault value or the second diagnostic indicator flag is equal to the second fault value.

DETAILED DESCRIPTION

Figure 1:
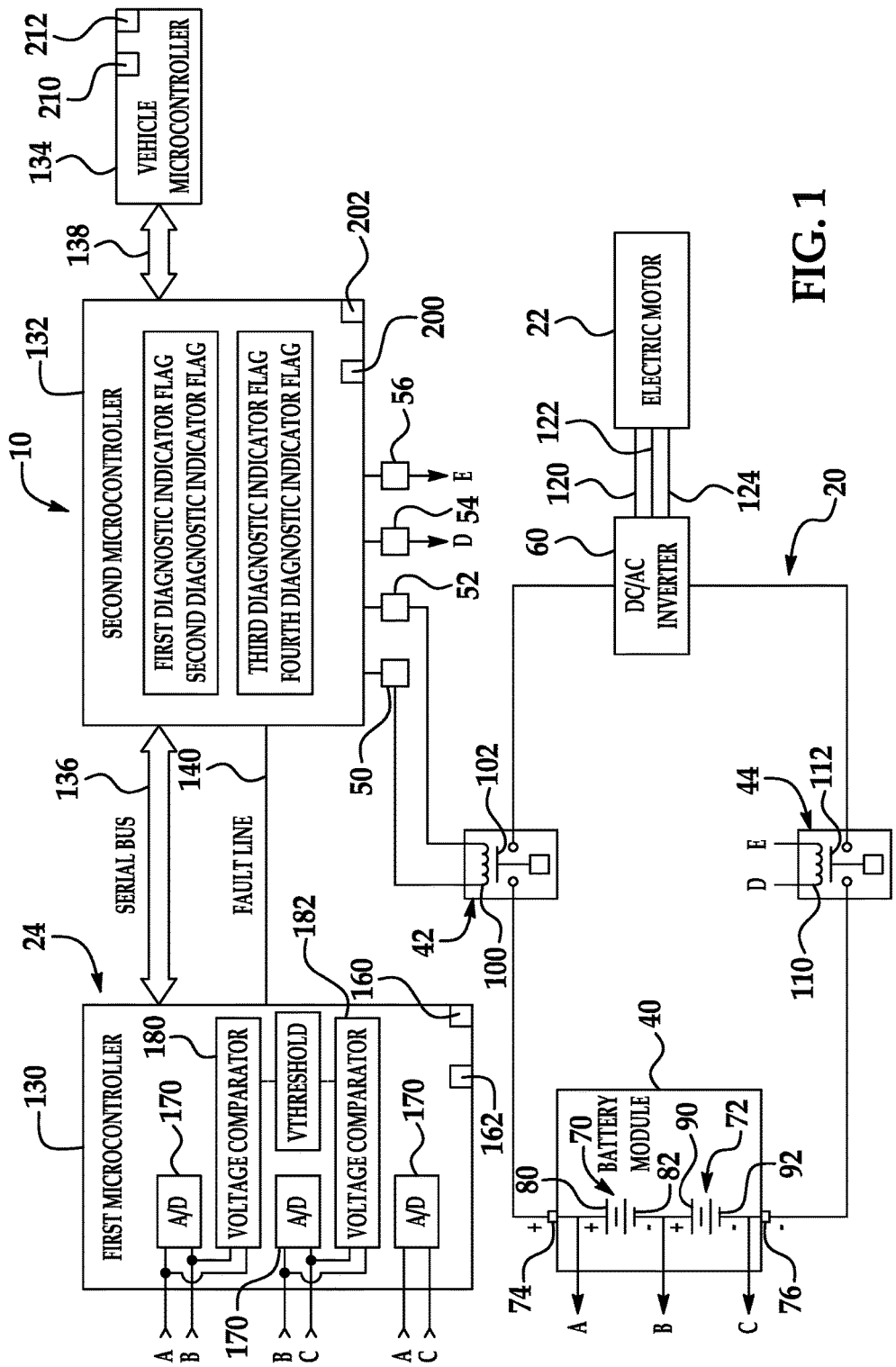
FIG. 1 is a schematic of a vehicle having a battery system, an electric motor, and a diagnostic system in accordance with an exemplary embodiment.
Figure 2:
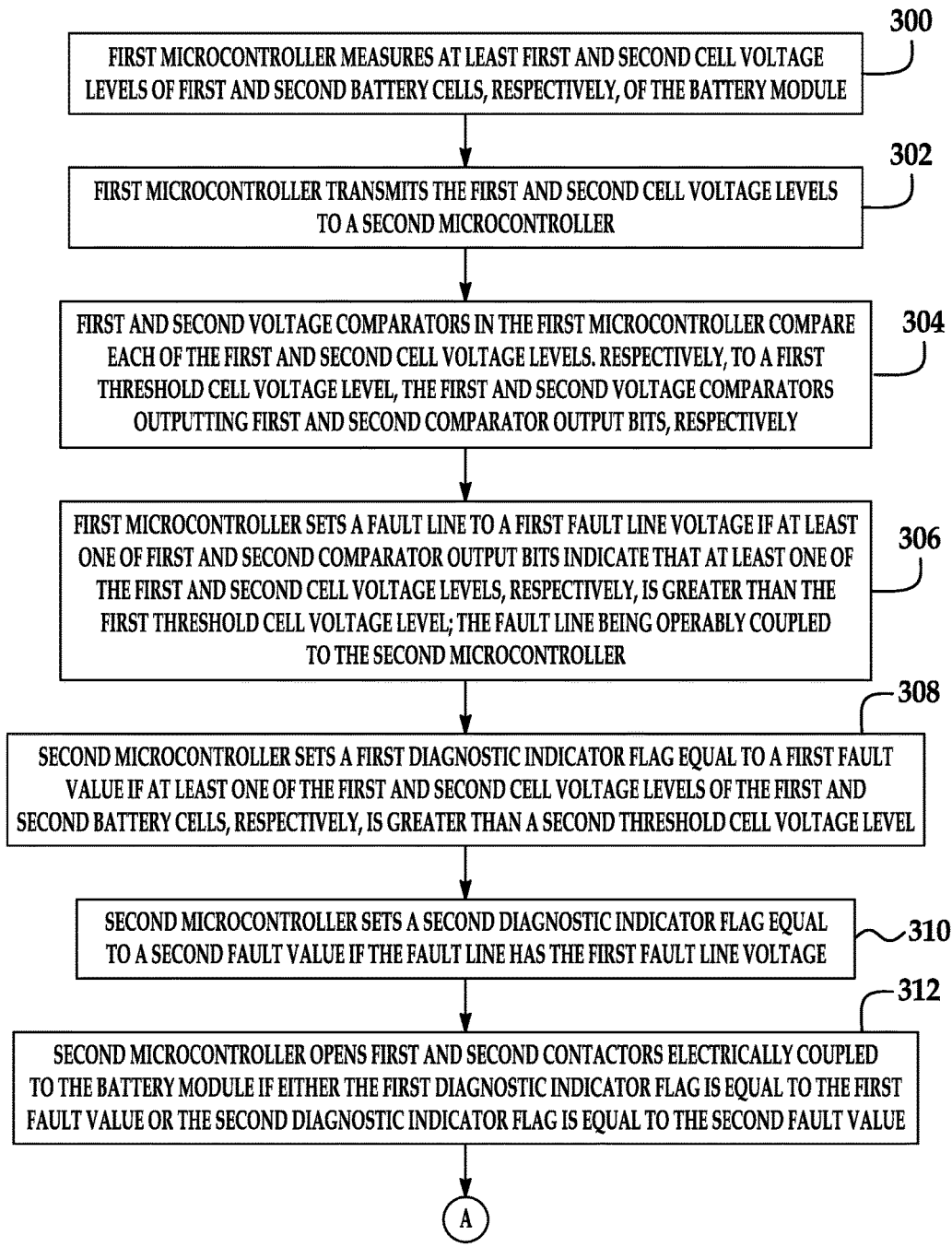
FIGS. 2-4 are flowcharts of a method for performing diagnostic tests on the battery system of FIG. 1 utilizing the diagnostic system of FIG. 1.
Figure 3:
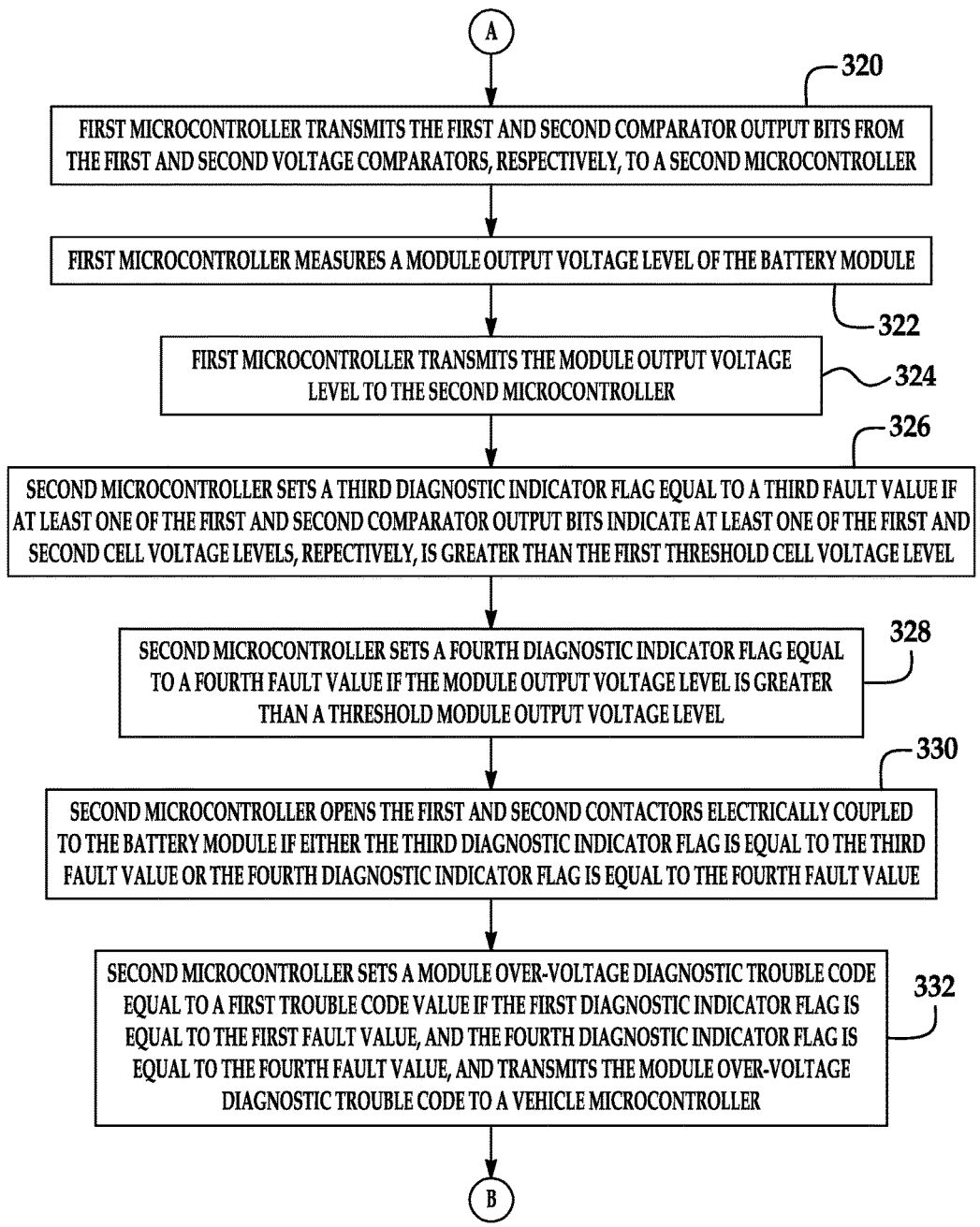
Figure 4:
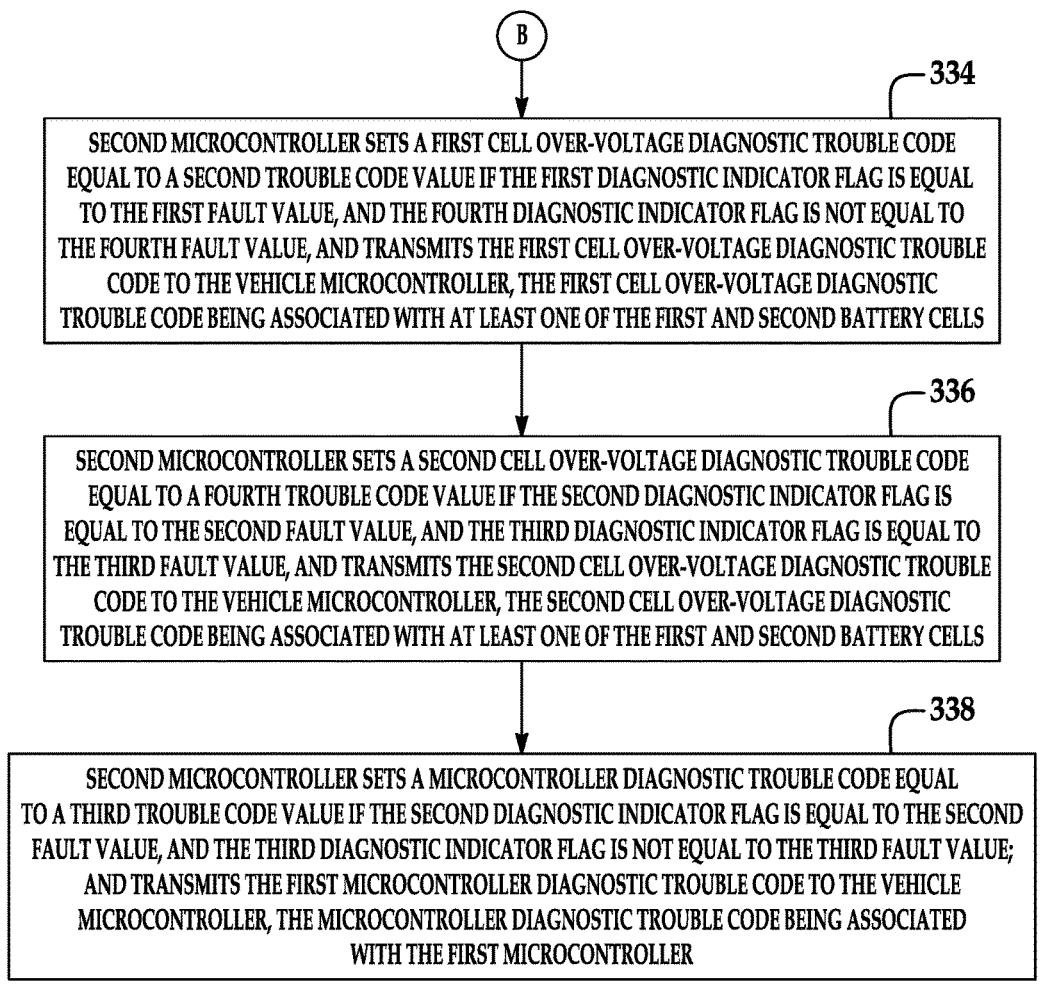

Referring to FIG. 1, a vehicle 10 includes a battery system 20, an electric motor 22, and a diagnostic system 24. An advantage of the vehicle 10 is that the vehicle 10 utilizes the diagnostic system 24 that performs a first diagnostic test on the battery system 20 utilizing first and second diagnostic indicator flags determined utilizing first and second hardware devices (e.g., analog-to-digital converter in a first microcontroller, and a fault line coupled between first and second microcontrollers), respectively. The diagnostic system 24 can open a contactor based on the first and second diagnostic indicator flags. Further, the diagnostic system 24 performs a second diagnostic test on the battery system 20 utilizing third and fourth diagnostic indicator flags determined from third and fourth hardware devices (e.g., voltage comparators in a first microcontroller, and a serial bus), respectively. Further, the inventive diagnostic system can open a contactor based on the third and fourth diagnostic indicator flags.

The battery system 20 includes a battery module 40, contactors 42, 44, voltage drivers, 50, 52, 54, 56, and a DC/AC inverter 60.

The battery module 40 has first and second battery cells, 70, 72 electrically coupled in series with one another between a positive battery module terminal 74 and a negative battery module terminal 76. In an exemplary embodiment, the first and second battery cells 70, 72 are pouch-type lithium-ion battery cells. Of course, in an alternative embodiment, each of the first and second battery cells 70, 72 could comprise another type of battery cell such as nickel-cadmium battery cell, a nickel-metal-hydride battery cell, or a lead acid battery cell for example. The first battery cell 70 has a positive terminal 80 and a negative terminal 82. Further, the second battery cell 72 has a positive terminal 90 and a negative terminal 92. The positive terminal 80 of the first battery cell 70 is coupled to positive battery module terminal 74. The negative terminal 82 of the first battery cell 70 is coupled to the positive terminal 90 of the second battery cell 72. Further, the negative terminal 92 of the second battery cell 72 is coupled to the negative battery module terminal 76. In an alternative embodiment, the battery module 40 could have a plurality of additional battery cells electrically coupled to one another in series with the first and second battery cells 70, 72.

The contactor 42 is electrically coupled in series between the positive battery module terminal 74 and the DC/AC inverter 60. The contactor 42 includes a contactor coil 100 and a contact 102. When the second microcontroller 132 generates first and second control signals that are received by the voltage drivers 50, 52, respectively, the voltage drivers 50, 52, energize the contactor coil 100, which moves the contact 102 to a closed operational position. Alternately, when the second microcontroller 132 stops generating the first and second control signals, the voltage drivers 50, 52 de-energize the contactor coil 100, which moves the contact 102 to an open operational position.

The contactor 44 is electrically coupled in series between the negative battery module terminal 76 and the DC/AC inverter 60. The contactor 44 includes a contactor coil 110 and a contact 112. When the second microcontroller 132 generates third and fourth control signals that are received by the voltage drivers 54, 56, respectively, the voltage drivers 54, 56, energize the contactor coil 110, which moves the contact 112 to a closed operational position. Alternately, when the second microcontroller 132 stops generating the third and fourth control signals, the voltage drivers 54, 56 de-energize the contactor coil 110, which moves the contact 112 to an open operational position.

The DC/AC inverter 60 is electrically coupled to and between the contactors 42, 44, and provides AC power to the electric motor 22 via the electrical lines 120, 122, 124.

The diagnostic system 24 includes a first microcontroller 130, a second microcontroller 132, a vehicle microcontroller 134, serial communication buses 136, 138 and a fault line 140.

The first microcontroller 130 includes a microprocessor 160, a memory device 162, an analog-to-digital (A/D) converter 170, and voltage comparators 180, 182. The microprocessor 160 operably communicates with the memory device 162, the analog-to-digital (A/D) converter 170, and the voltage comparators 180, 182. The microprocessor 160 utilizes software instructions stored in the memory device 162 to implement at least in part the flowchart steps described hereinafter for the first microcontroller 130.

The A/D converter 170 includes input ports A and B which are electrically coupled to the positive terminal 80 and the negative terminal 82, respectively, of the first battery cell 70 to measure a voltage level between the terminals 80, 82. The A/D converter 170 includes input ports B and C which are electrically coupled to the positive terminal 90 and the negative terminal 92, respectively, of the second battery cell 72 to measure a voltage level between the terminals 90, 92. The A/D converter 70 also measures a battery module voltage level of the battery module 40 utilizing the input ports A and C.

The voltage comparator 180 is electrically coupled to the input ports A and B, and compares the voltage level (between input ports A and B) of the first battery cell 70 to a threshold cell voltage level (VTHRESHOLD). If the voltage level of the first battery cell 70 is greater than the threshold cell voltage level, the voltage comparator 180 sets an associated comparator output bit to a binary "1" value. Otherwise, the voltage comparator 180 sets the associated comparator output bit to a binary "0" value.

The voltage comparator 182 is electrically coupled to the input ports B and C, and compares the voltage level (between input ports B and C) of the second battery cell 72 to the threshold cell voltage level (VTHRESHOLD). If the voltage level of the second battery cell 72 is greater than the threshold cell voltage level, the voltage comparator 182 sets an associated comparator output bit to a binary "1" value. Otherwise, the voltage comparator 182 sets the associated comparator output bit to a binary "0" value.

The first microprocessor 130 operably communicates with the second microcontroller 132 utilizing a serial communication bus 136. Further, the first microprocessor 130 sets a fault line 140 to a first fault line voltage if at least one of the first and second voltage levels of the first and second battery cells 70, 72, respectively, are greater than the threshold cell voltage level (VTHRESHOLD). The operation of the first microcontroller 130 will be discussed in greater detail hereinafter.

The second microcontroller 132 includes a microprocessor 200 and a memory device 202. The microprocessor 200 operably communicates with the memory device 202. Further, the microprocessor 200 operably communicates with the microprocessor 160 of the first microcontroller 130 via the serial communication bus 136 and the fault line 140. Still further, the microprocessor 200 operably communicates with a microprocessor 210 of the vehicle microcontroller 134 via the serial communication bus 138. The microprocessor 200 utilizes software instructions stored in the memory device 202 to implement at least in part the flowchart steps described hereinafter for the second microcontroller 132. The operation of the second microcontroller 132 will be discussed in greater detail hereinafter.

The vehicle microcontroller 134 includes a microprocessor 210 and a memory device 212. The microprocessor 210 operably communicates with the memory device 212. The microprocessor 210 utilizes software instructions stored in the memory device 212 to implement at least in part the flowchart steps described hereinafter for the vehicle microcontroller 134.

Referring to FIGS. 1-4, a flowchart of a method for performing diagnostic tests on the battery system 20 utilizing the diagnostic system 24 in accordance with another exemplary embodiment is provided.

At step 300, the first microcontroller 130 measures at least first and second cell voltage levels of first and second battery cells 70, 72, respectively, of the battery module 40.

At step 302, the first microcontroller 130 transmits the first and second cell voltage levels to a second microcontroller 132.

At step 304, voltage comparators 180, 182 in the first microcontroller 130 compare each of the first and second cell voltage levels, respectively, to a first threshold cell voltage level. The voltage comparators 180, 182 output first and second comparator output bits, respectively.

At step 306, the first microcontroller 130 sets a fault line 140 to a first fault line voltage if at least one of first and second comparator output bits indicate that at least one of the first and second cell voltage levels, respectively, is greater than the first threshold cell voltage level. The fault line 140 is operably coupled to the second microcontroller 132.

At step 308, the second microcontroller 132 sets a first diagnostic indicator flag equal to a first fault value if at least one of the first and second cell voltage levels of first and second battery cells 70, 72, respectively, is greater than a second threshold cell voltage level.

At step 310, the second microcontroller 132 sets a second diagnostic indicator flag equal to a second fault value if the fault line 140 has the first fault line voltage.

At step 312, the microcontroller 132 opens contactors 42, 44 electrically coupled to the battery module 40 if either the first diagnostic indicator flag is equal to the first fault value or the second diagnostic indicator flag is equal to the second fault value.

At step 320, the first microcontroller 130 transmits the first and second comparator output bits from the first and second voltage comparators, respectively, to the second microcontroller 132.

At step 322, the first microcontroller 130 measures a module output voltage level of the battery module 40.

At step 324, the first microcontroller 130 transmits the module output voltage level to the second microcontroller 132.

At step 326, the second microcontroller 132 sets a third diagnostic indicator flag equal to a third fault value if at least one of the first and second comparator output bits indicate at least one of the first and second cell voltage levels, respectively, is greater than the first threshold cell voltage level.

At step 328, the second microcontroller 132 sets a fourth diagnostic indicator flag equal to a fourth fault value if the module output voltage level is greater than a threshold module output voltage level.

At step 330, the second microcontroller 132 opens the contactors 42, 44 electrically coupled to the battery module 40 if either the third diagnostic indicator flag is equal to the third fault value or the fourth diagnostic indicator flag is equal to the fourth fault value.

At step 332, the second microcontroller 132 sets a module over-voltage diagnostic trouble code equal to a first trouble code value if the first diagnostic indicator flag is equal to the first fault value, and the fourth diagnostic indicator flag is equal to the fourth fault value, and transmits the module over-voltage diagnostic trouble code to the vehicle microcontroller 134.

At step 334, the second microcontroller 132 sets a first cell over-voltage diagnostic trouble code equal to a second trouble code value if the first diagnostic indicator flag is equal to the first fault value, and the fourth diagnostic indicator flag is not equal to the fourth fault value, and transmits the first cell over-voltage diagnostic trouble code to the vehicle microcontroller 134. The first cell over-voltage diagnostic trouble code is associated with at least one of the first and second battery cells 70, 72.

At step 336, the second microcontroller 132 sets a second cell over-voltage diagnostic trouble code equal to a fourth trouble code value if the second diagnostic indicator flag is equal to the second fault value, and the third diagnostic indicator flag is equal to the third fault value, and transmits the second cell over-voltage diagnostic trouble code to the vehicle microcontroller 134. The second cell over-voltage diagnostic trouble code is associated with at least one of the first and second battery cells 70, 72.

At step 338, the second microcontroller 132 sets a microcontroller diagnostic trouble code equal to a third trouble code value if the second diagnostic indicator flag is equal to the second fault value, and the third diagnostic indicator flag is not equal to the third fault value; and transmits the first microcontroller diagnostic trouble code to the vehicle microcontroller 134. The microcontroller diagnostic trouble code is associated with the first microcontroller 130.

Figure 5:
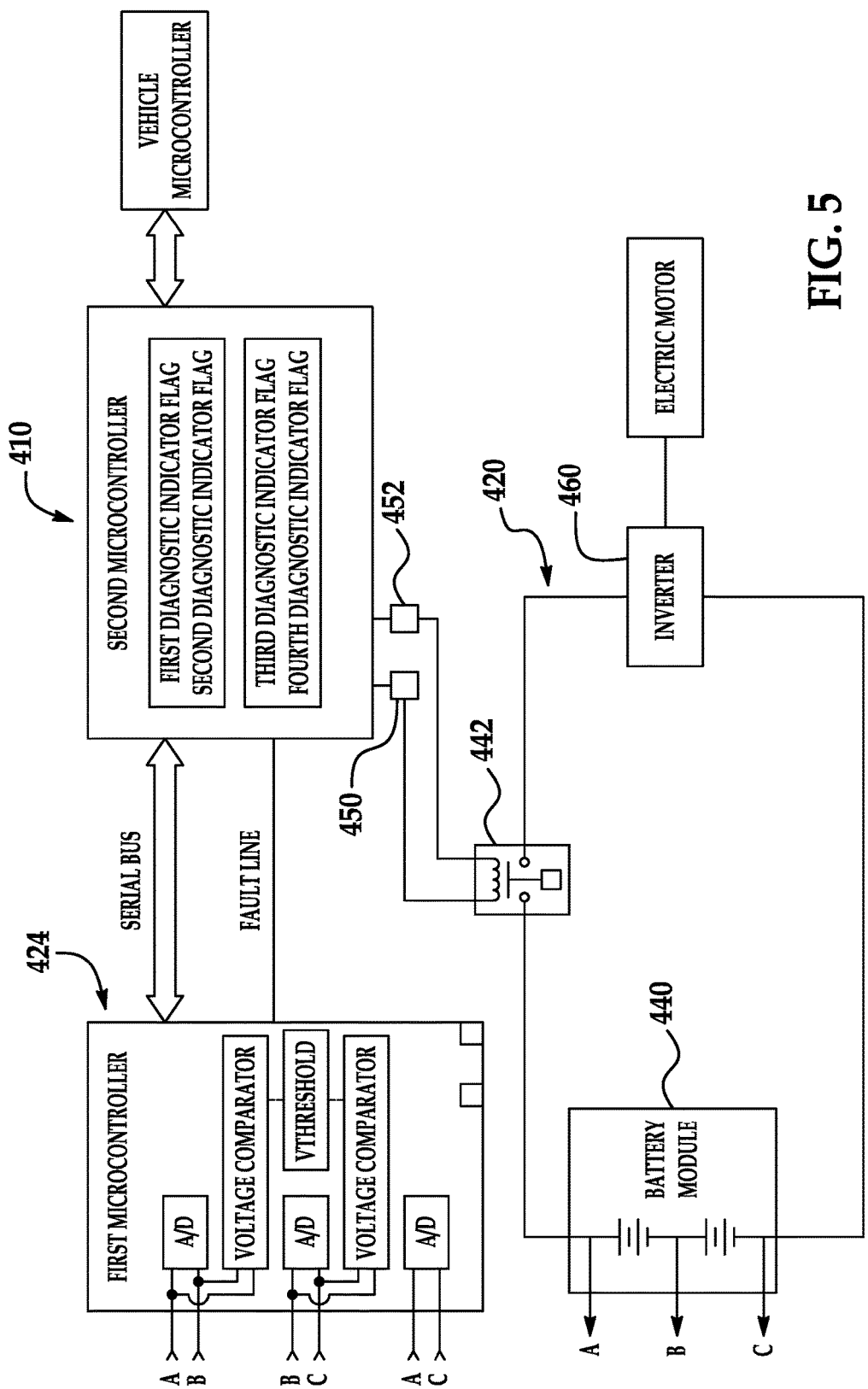
FIG. 5 is a schematic of a vehicle a battery system, an electric motor, and a diagnostic system in accordance with another exemplary embodiment.

Referring to FIG. 5, a vehicle 410 includes a battery system 420, an electric motor 422, and a diagnostic system 424. A primary difference between the battery system 420 and the battery system 20 is that the battery system 420 only utilizes a single contactor 442 electrically coupled between the battery module 440 and the inverter 460, instead of a pair of contactors. Another primary difference between the battery system 420 and the battery system 20 is that the battery system 420 only utilizes a pair of voltage drivers 450, 452 to energize and de-energize the single contactor 442, instead of four voltage drivers to energize and de-energize two contactors. The structure and functionality of the diagnostic system 424 is substantially similar to the diagnostic system 24, except that the diagnostic system 424 will open only the single contactor 442 if at least one of the first, second, third, and fourth diagnostic indicator flags are set to the first, second, third, and fourth fault values, respectively.

The diagnostic system described herein provides a substantial advantage over other systems and methods. In particular, the diagnostic system performs a first diagnostic test on the battery system 20 utilizing first and second diagnostic indicator flags determined from first and second hardware sensing devices, respectively. Further, the diagnostic system 24 performs a second diagnostic test on the battery system 20 utilizing third and fourth diagnostic indicator flags determined from third and fourth hardware sensing devices, respectively.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a battery system, the battery system having a battery module electrically coupled to a contactor, comprising:

a first microcontroller being programmed to measure at least first and second cell voltage levels of first and second battery cells, respectively, of the battery module;

the first microcontroller being further programmed to transmit the first and second cell voltage levels to a second microcontroller;

the first microcontroller having first and second voltage comparators therein, the first voltage comparator comparing the first cell voltage level to a first threshold cell voltage level and outputting a first comparator output bit; the second voltage comparator comparing the second cell voltage level to the first threshold cell voltage level and outputting a second comparator output bit;

a fault line being electrically coupled to and between the first microcontroller and the second microcontroller;

the first microcontroller being further programmed to set the fault line to a first fault line voltage if the first comparator output bit indicates that the first cell voltage level is greater than the first threshold cell voltage level;

the first microcontroller being further programmed to set the fault line to the first fault line voltage if the second comparator output bit indicates that the second cell voltage level is greater than the first threshold cell voltage level;

the first microcontroller being further programmed to transmit the first and second comparator output bits from the first and second voltage comparators, respectively, to the second microcontroller;

the second microcontroller being programmed to set a first diagnostic indicator flag equal to a first fault value if the first cell voltage level of the first battery cell is greater than a second threshold cell voltage level;

the second microcontroller being programmed to set the first diagnostic indicator flag equal to the first fault value if the second cell voltage level of the second battery cell is greater than the second threshold cell voltage level;

the second microcontroller being further programmed to set a second diagnostic indicator flag equal to a second fault value if the fault line has the first fault line voltage;

the second microcontroller being further programmed to open the contactor electrically coupled to the battery module if either the first diagnostic indicator flag is equal to the first fault value or the second diagnostic indicator flag is equal to the second fault value;

the first microcontroller being further programmed to measure a module output voltage level of the battery module;

the first microcontroller being further programmed to transmit the module output voltage level to the second microcontroller;

the second microcontroller being further programmed to set a third diagnostic indicator flag equal to a third fault value if the first comparator output bit indicates that the first cell voltage value is greater than the first threshold cell voltage level;

the second microcontroller being further programmed to set the third diagnostic indicator flag equal to the third fault value if the second comparator output bit indicates that the second cell voltage value is greater than the first threshold cell voltage level;

the second microcontroller being further programmed to set a fourth diagnostic indicator flag equal to a fourth fault value if the module output voltage level is greater than a threshold module output voltage level;

the second microcontroller being further programmed to open the contactor electrically coupled to the battery module if either the third diagnostic indicator flag is equal to the third fault value or the fourth diagnostic indicator flag is equal to the fourth fault value;

a vehicle microcontroller operably communicating with the second microcontroller;

the second microcontroller being further programmed to set a first cell over-voltage diagnostic trouble code equal to a first trouble code value if the first diagnostic indicator flag is equal to the first fault value, and the fourth diagnostic indicator flag is not equal to the fourth fault value, the first cell over-voltage diagnostic trouble code being associated with at least one of the first and second battery cells; and the second microcontroller being further programmed to transmit the first cell over-voltage diagnostic trouble code to the vehicle microcontroller.

2. The diagnostic system of claim 1, wherein:

the second microcontroller being further programmed to set a module over-voltage diagnostic trouble code equal to a second trouble code value if the first diagnostic indicator flag is equal to the first fault value, and the fourth diagnostic indicator flag is equal to the fourth fault value; and the second microcontroller being further programmed to transmit the module over-voltage diagnostic trouble code to the vehicle microcontroller.

3. The diagnostic system of claim 1, wherein:

the second microcontroller being further programmed to set the first cell over-voltage diagnostic trouble code equal to a second trouble code value if the second diagnostic indicator flag is equal to the second fault value, and the third diagnostic indicator flag is equal to the third fault value, the first cell over-voltage diagnostic trouble code being associated with at least one of the first and second battery cells; and the second microcontroller being further programmed to transmit the first cell over-voltage diagnostic trouble code to the vehicle microcontroller.

4. The diagnostic system of claim 1, wherein the second microcontroller being further programmed to set a microprocessor diagnostic trouble code equal to a second trouble code value if the second diagnostic indicator flag is equal to the second fault value, and the third diagnostic indicator flag is not equal to the third fault value, the microcontroller diagnostic trouble code being associated with the first microcontroller; and the second microcontroller being further programmed to transmit the microprocessor diagnostic trouble code to the vehicle microcontroller.

5. The diagnostic system of claim 1, wherein the first microcontroller being programmed to measure the first and second cell voltage levels of first and second battery cells, respectively, of the battery module, utilizing an analog-to-digital converter therein.

6. The diagnostic system of claim 1, wherein the first diagnostic indicator flag is determined utilizing the analog-to-digital converter, and the second diagnostic indicator flag is determined utilizing the fault line.

7. A diagnostic system for a battery system, the battery system having a battery module electrically coupled to a contactor, the battery module having first and second battery cells, comprising:

a first microcontroller having first and second voltage comparators therein, the first voltage comparator comparing a first cell voltage level of the first battery cell to a first threshold cell voltage level and outputting a first comparator output bit; the second voltage comparator comparing a second cell voltage level of the second battery cell to the first threshold cell voltage level and outputting a second comparator output bit;

the first microcontroller being programmed to transmit the first and second comparator output bits from the first and second voltage comparators, respectively, to a second microcontroller;

the first microcontroller being further programmed to measure a module output voltage level of the battery module;

the first microcontroller being further programmed to transmit the module output voltage level to the second microcontroller;

the second microcontroller being further programmed to set a first diagnostic indicator flag equal to a first fault value if the first comparator output bit indicates that the first cell voltage level is greater than the first threshold cell voltage level;

the second microcontroller being further programmed to set the first diagnostic indicator flag equal to the first fault value if the second comparator output bit indicates that the second cell voltage level is greater than the first threshold cell voltage level;

the second microcontroller being further programmed to set a second diagnostic indicator flag equal to a second fault value if the module output voltage level is greater than a threshold module output voltage level; and the second microcontroller being further programmed to open the contactor electrically coupled to the battery module if either the first diagnostic indicator flag is equal to the first fault value or the second diagnostic indicator flag is equal to the second fault value.

8. The diagnostic system of claim 7, wherein the first microcontroller being programmed to measure the module output voltage level of the battery module, utilizing an analog-to-digital converter therein.

9. The diagnostic system of claim 8, wherein the first diagnostic indicator flag is determined utilizing the first and second voltage comparators, and the second diagnostic indicator flag is determined utilizing the analog-to-digital converter.

10. A diagnostic system for a battery system, the battery system having a battery module electrically coupled to a contactor, comprising:

a first microcontroller being programmed to measure first and second cell voltage levels of first and second battery cells, respectively, of the battery module;

the first microcontroller being further programmed to transmit the first and second cell voltage levels to a second microcontroller;

the first microcontroller having first and second voltage comparators therein, the first voltage comparator comparing the first cell voltage level to a first threshold cell voltage level and outputting a first comparator output bit; the second voltage comparator comparing the second cell voltage level to the first threshold cell voltage level and outputting a second comparator output bit;

a fault line being electrically coupled to and between the first microcontroller and the second microcontroller;

the first microcontroller being further programmed to set the fault line to a first fault line voltage if the first comparator output bit indicates that the first cell voltage level is greater than the first threshold cell voltage level;

the first microcontroller being further programmed to set the fault line to the first fault line voltage if the second comparator output bit indicates that the second cell voltage level is greater than the first threshold cell voltage level;

the first microcontroller being further programmed to transmit the first and second comparator output bits from the first and second voltage comparators, respectively, to the second microcontroller;

the second microcontroller being programmed to set a first diagnostic indicator flag equal to a first fault value if the first cell voltage level of the first battery cell is greater than a second threshold cell voltage level;

the second microcontroller being programmed to set the first diagnostic indicator flag equal to the first fault value if the second cell voltage level of the second battery cell is greater than the second threshold cell voltage level;

the second microcontroller being further programmed to set a second diagnostic indicator flag equal to a second fault value if the fault line has the first fault line voltage; and the second microcontroller being further programmed to open the contactor electrically coupled to the battery module if either the first diagnostic indicator flag is equal to the first fault value or the second diagnostic indicator flag is equal to the second fault value.

11. The diagnostic system of claim 10, further comprising:

the first microcontroller being further programmed to measure a module output voltage level of the battery module;

the first microcontroller being further programmed to transmit the module output voltage level to the second microcontroller;

the second microcontroller being further programmed to set a third diagnostic indicator flag equal to a third fault value if at least one of the first and second comparator output bits indicate at least one of the first and second cell voltage levels, respectively, is greater than the first threshold cell voltage level;

the second microcontroller being further programmed to set a fourth diagnostic indicator flag equal to a fourth fault value if the module output voltage level is greater than a threshold module output voltage level; and the second microcontroller being further programmed to open the contactor electrically coupled to the battery module if either the third diagnostic indicator flag is equal to the third fault value or the fourth diagnostic indicator flag is equal to the fourth fault value.

* * * * *